United States Patent
Jung et al.

(10) Patent No.: US 8,053,687 B2
(45) Date of Patent: Nov. 8, 2011

(54) SEMICONDUCTOR DEVICE AND TOUCH SENSOR DEVICE

(75) Inventors: Duck-Young Jung, Yongin-si (KR); Jin-Woo Chung, Seongnam-si (KR); Bang-Won Lee, Yongin-si (KR)

(73) Assignee: Atlab Inc. (KR)

( * ) Notice: Subject to any disclaimer, the term of this patent is extended or adjusted under 35 U.S.C. 154(b) by 578 days.

(21) Appl. No.: 12/304,446

(22) PCT Filed: May 28, 2007

(86) PCT No.: PCT/KR2007/002567
§ 371 (c)(1),
(2), (4) Date: Dec. 11, 2008

(87) PCT Pub. No.: WO2007/145433
PCT Pub. Date: Dec. 21, 2007

(65) Prior Publication Data
US 2009/0152022 A1    Jun. 18, 2009

(30) Foreign Application Priority Data

Jun. 13, 2006    (KR) .................. 10-2006-0053189

(51) Int. Cl.
*H01L 23/02* (2006.01)
*H01L 23/58* (2006.01)
*B32B 3/26* (2006.01)
*G06F 3/042* (2006.01)
*G06F 3/041* (2006.01)

(52) U.S. Cl. ............... 178/18.03; 345/173; 178/18.09; 257/642; 257/680; 264/135

(58) Field of Classification Search .......... 463/16–17, 463/25–26, 40, 42, 46, 29; 362/227; 340/539.22, 340/286.09; 84/724, 645, 600; 710/74; 709/201; 315/291, 312; 700/9; 365/145; 257/666, 257/680; 438/21; 264/135
See application file for complete search history.

(56) References Cited

U.S. PATENT DOCUMENTS
6,254,815 B1 * 7/2001 Cheperak ................ 264/135
(Continued)

FOREIGN PATENT DOCUMENTS
JP    01-120616    5/1989
(Continued)

OTHER PUBLICATIONS

International Search Report for PCT/KR2007/002567 dated Aug. 20, 2007.
(Continued)

*Primary Examiner* — Quan-Zhen Wang
*Assistant Examiner* — Lin Li
(74) *Attorney, Agent, or Firm* — Cantor Colburn LLP

(57) ABSTRACT

Provided are a semiconductor device and a touch sensor device. The semiconductor device includes a die including a sense signal generator for sensing a touch signal to generate a sense signal; a conductive die-attach pad attached to the die to generate the touch signal; and a package for packaging the die and the die-attach pad, wherein the die-attach pad generates the touch signal depending on whether a touch object comes into contact with the package. The touch sensor device includes a plurality of semiconductor devices connected in a daisy-chain communication mode, wherein each of the semiconductor devices includes a die including a sense signal generator for sensing a touch signal to generate a sense signal; a conductive die-attach pad attached to the die to generate the touch signal; and a package for packaging the die and the die-attach pad, wherein the die-attach pad generates the touch signal depending on whether a touch object is brought into contact with the package. The semiconductor device enables the size and position of a touch pad to be known in advance during the fabrication of a die so that a sensitivity adjusting process can be simplified. Also, since the touch pad is included in a touch sensor, a system can be simply configured at low cost. Furthermore, the touch sensor device requires no additional sensitivity adjusting process and enables a plurality of touch sensor systems to be constructed at low cost by simply connecting a small number of electrical signals.

19 Claims, 12 Drawing Sheets

U.S. PATENT DOCUMENTS

| | | | |
|---|---|---|---|
| 2002/0008308 A1* | 1/2002 | Crane et al. | 257/680 |
| 2003/0102533 A1* | 6/2003 | Siegel et al. | 257/642 |
| 2008/0088592 A1* | 4/2008 | Fry | 345/173 |
| 2010/0187023 A1* | 7/2010 | Min | 178/18.09 |

FOREIGN PATENT DOCUMENTS

| | | |
|---|---|---|
| JP | 2001-141411 | 5/2001 |
| JP | 2002-048507 | 2/2002 |
| JP | 2003-235830 | 8/2003 |
| JP | 2003-282791 | 10/2003 |
| JP | 2003-536085 | 12/2003 |
| JP | 2004-223263 | 8/2004 |
| KR | 10-2000-0051980 | 8/2000 |
| KR | 10-2003-0047405 | 6/2003 |
| KR | 10-2006-0063335 | 6/2006 |

OTHER PUBLICATIONS

Written Opinion for PCT/KR2007/002567 dated Aug. 20, 2007.
Japanese Office Action-Japanese Application No. 2009-515294 issued on Apr. 26, 2011.

* cited by examiner

[Fig. 1]
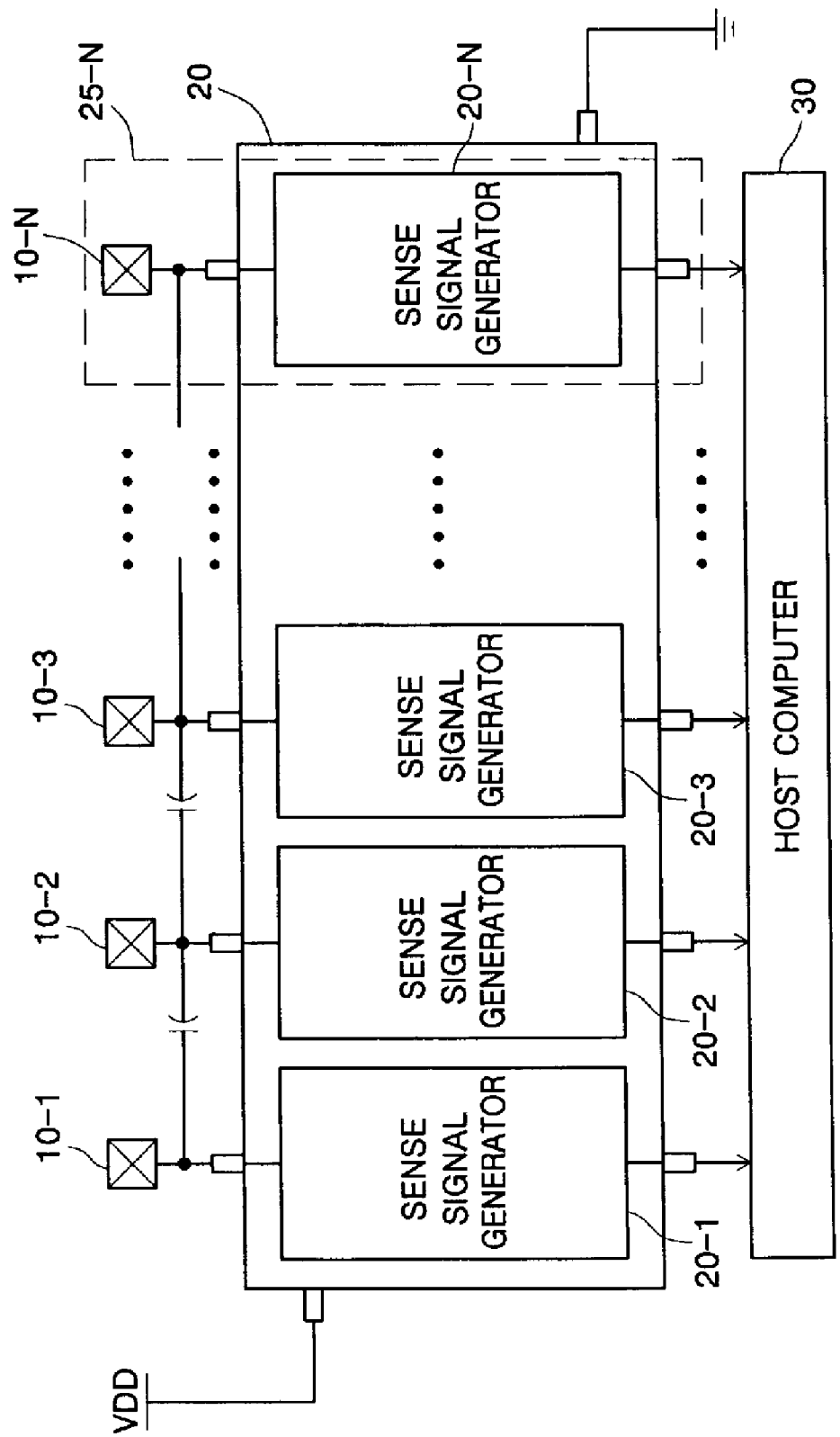

[Fig. 2]
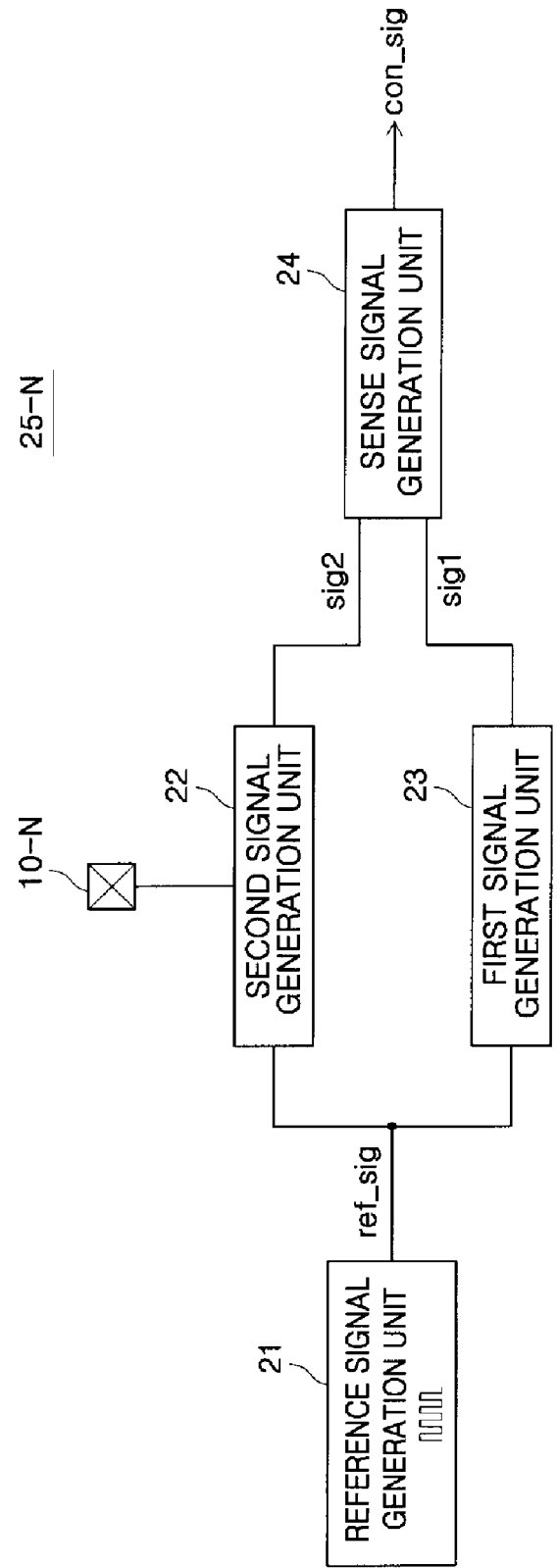

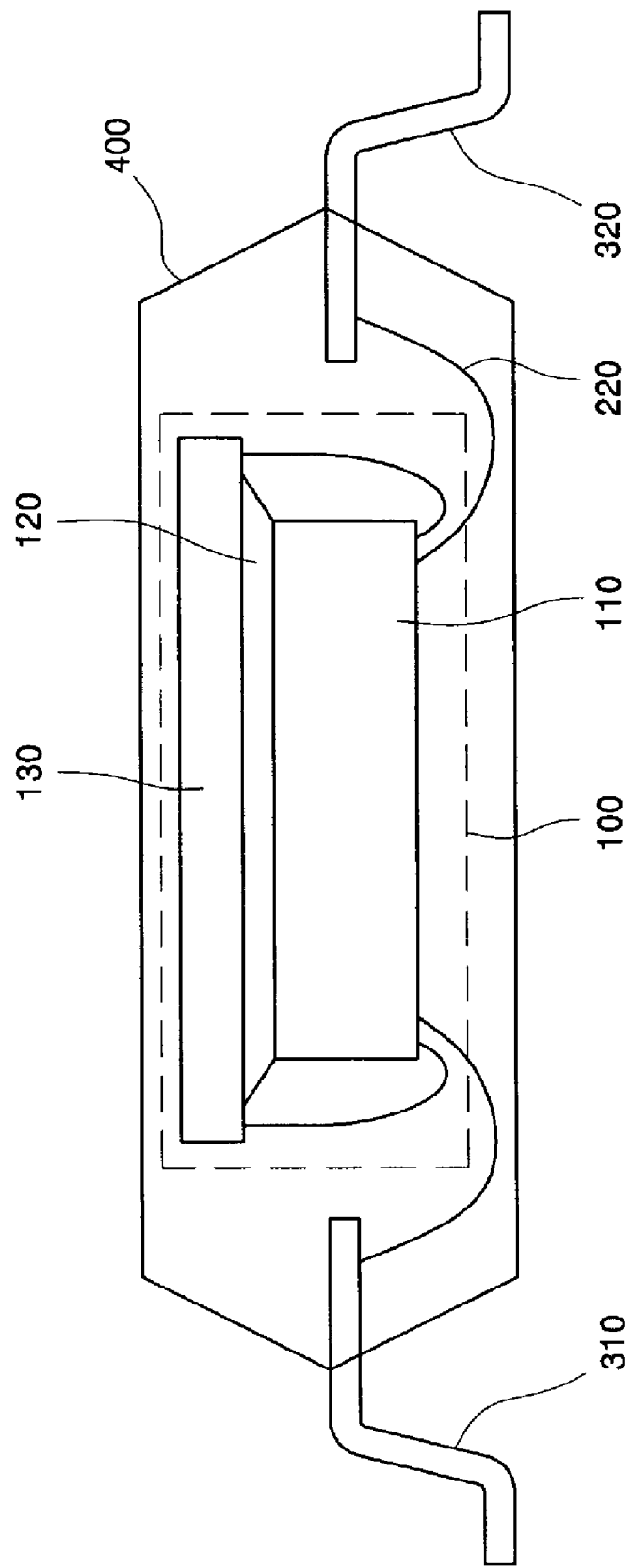
[Fig. 3]

[Fig. 4]
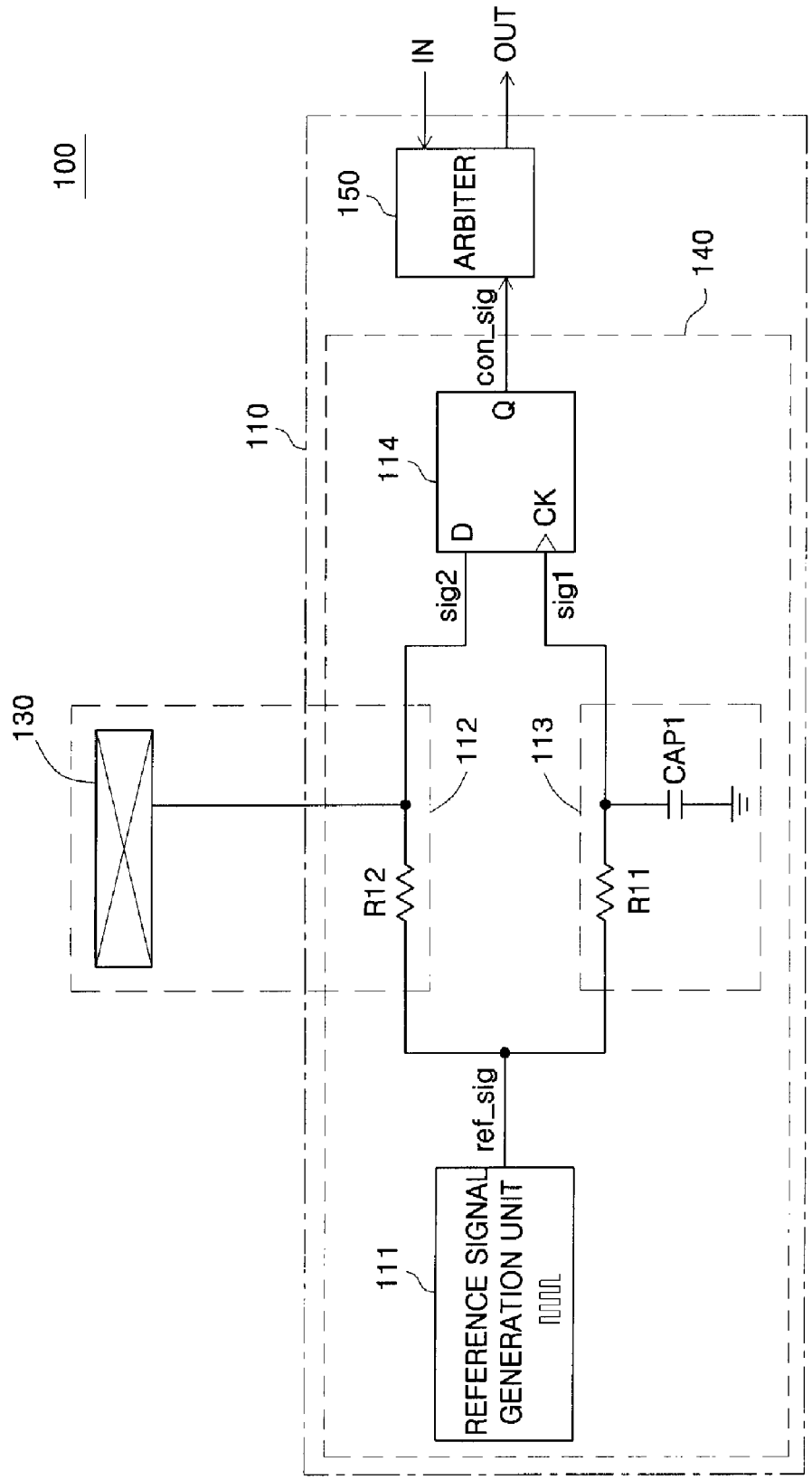

[Fig. 5]
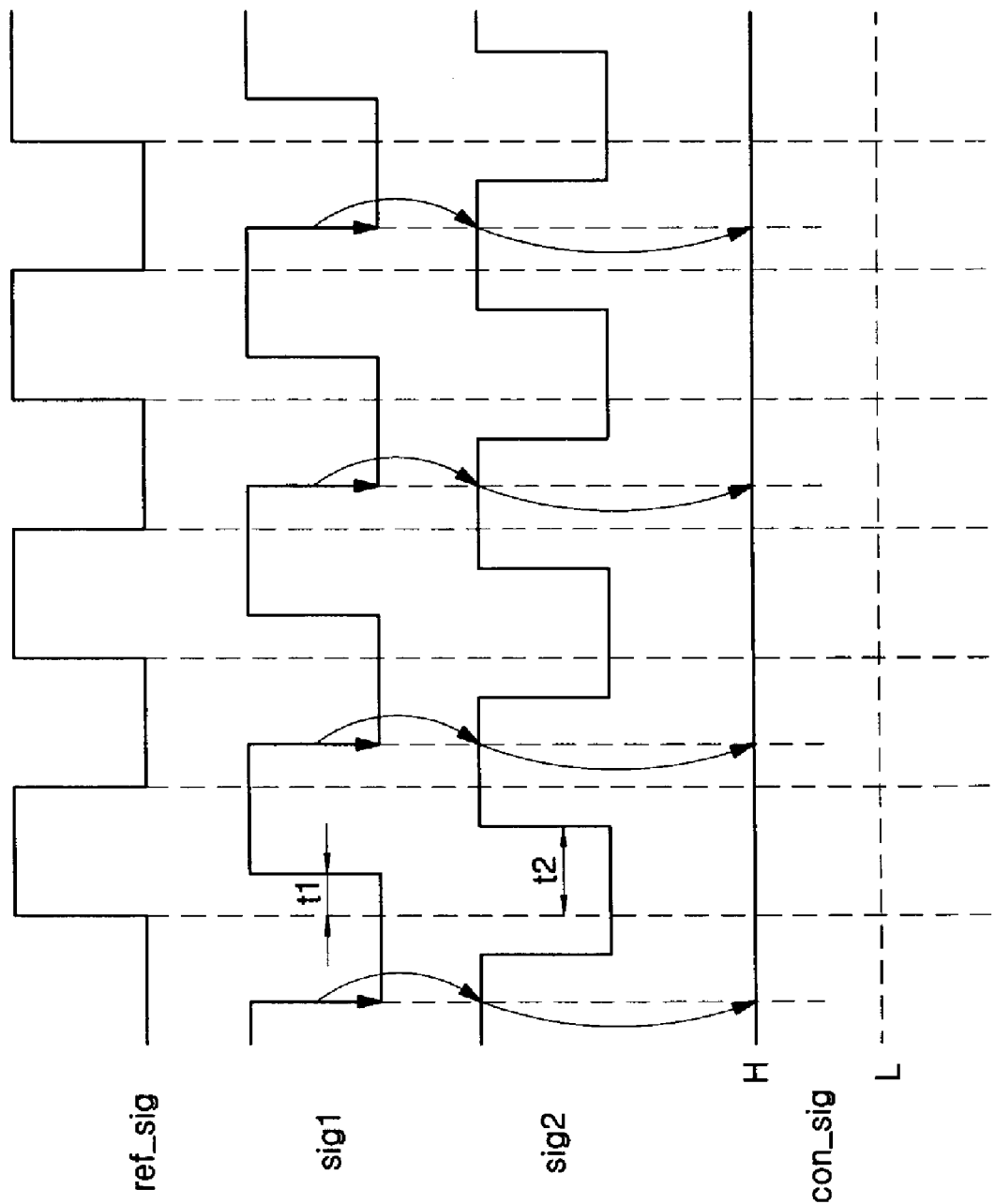

[Fig. 6]
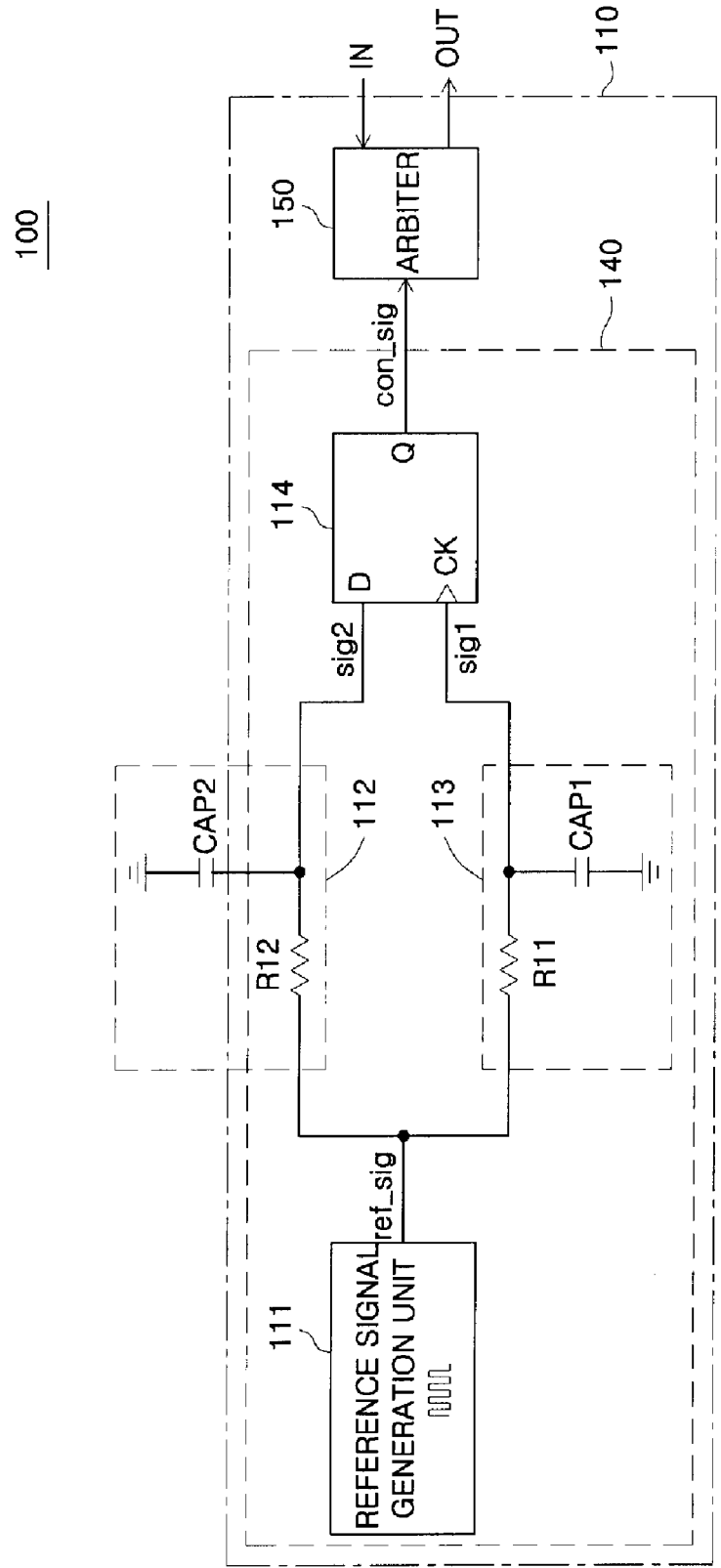

[Fig. 7]
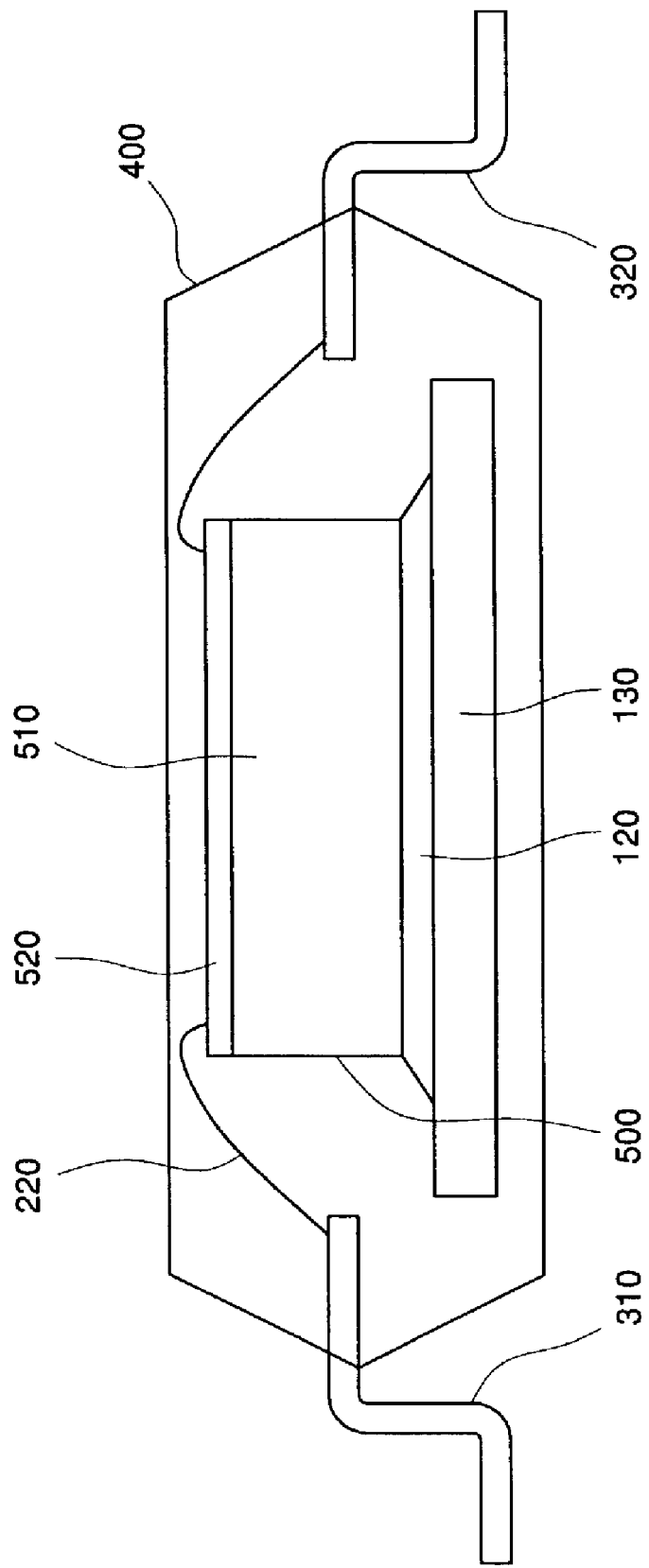

[Fig. 8]
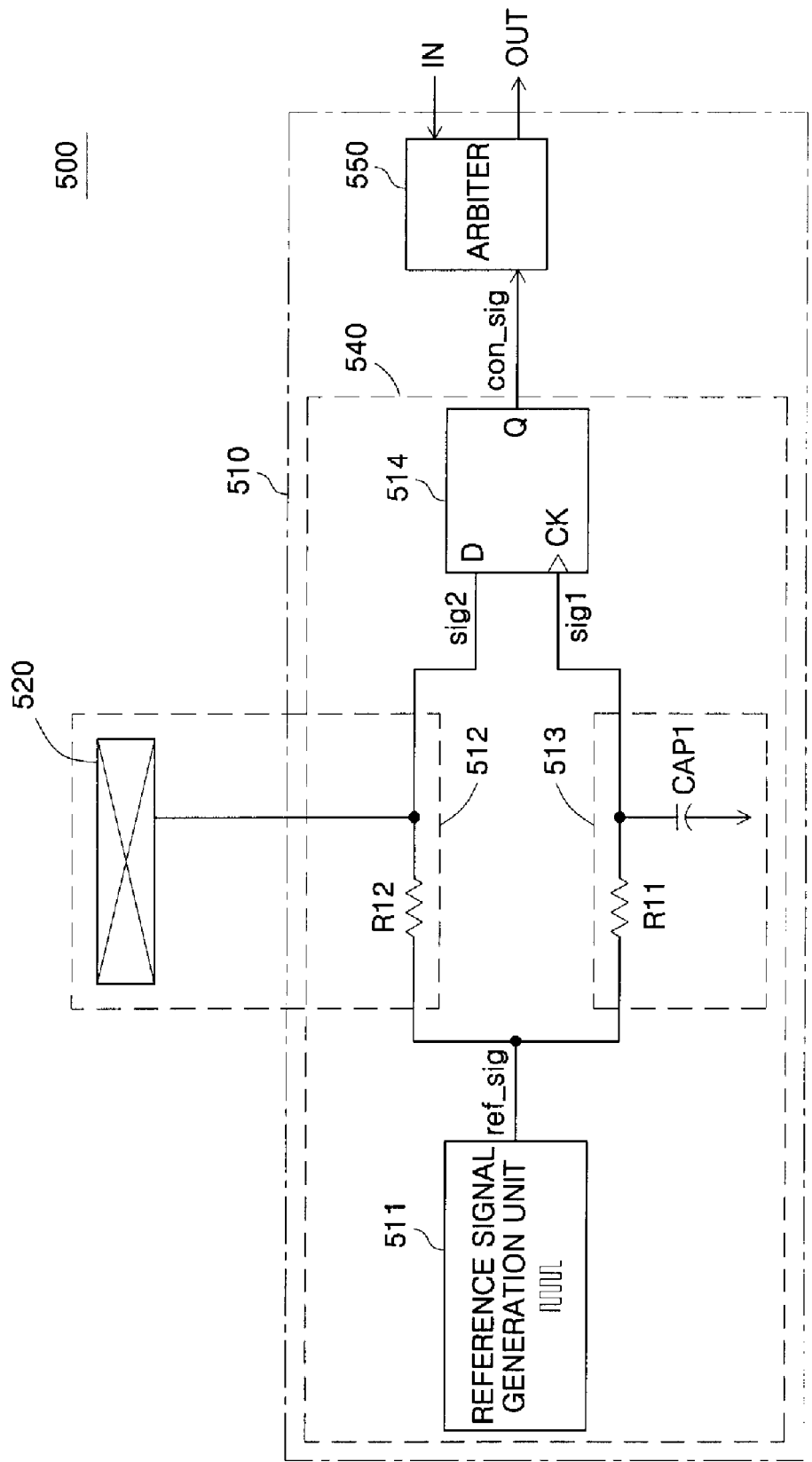

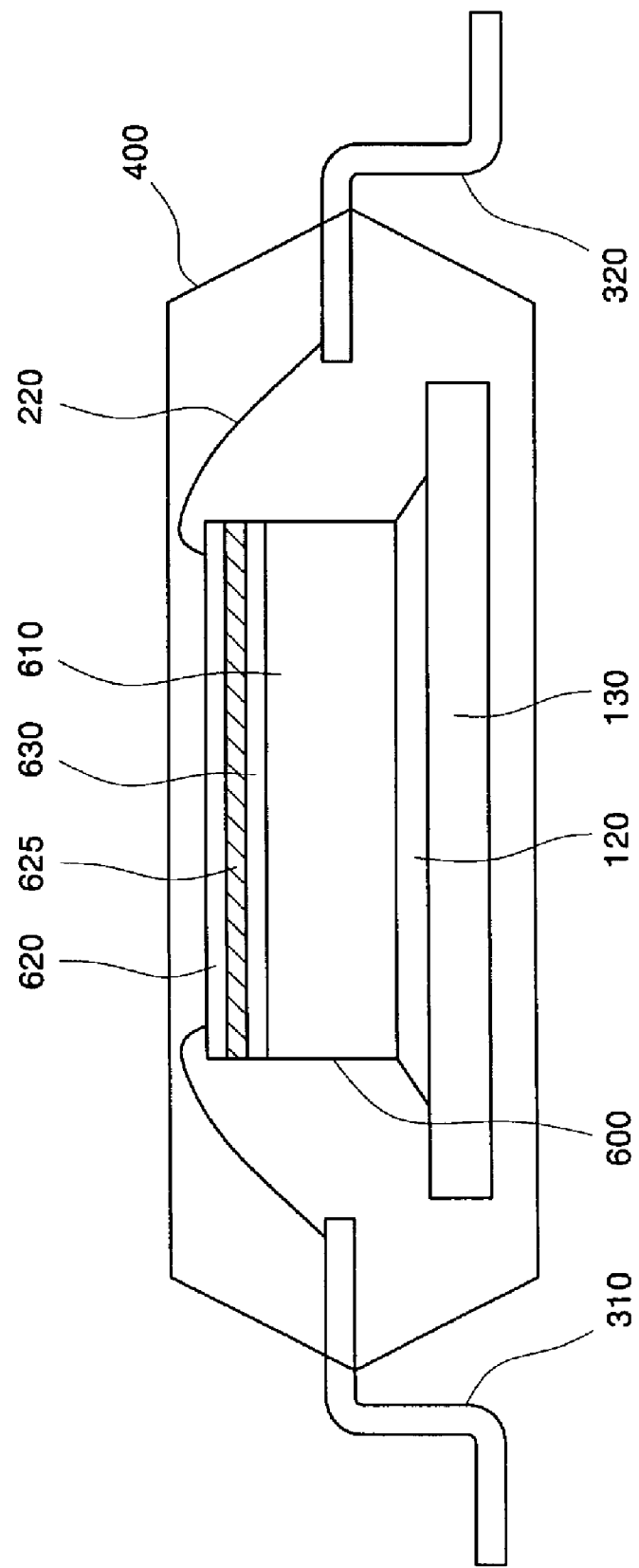
[Fig. 9]

[Fig. 10]
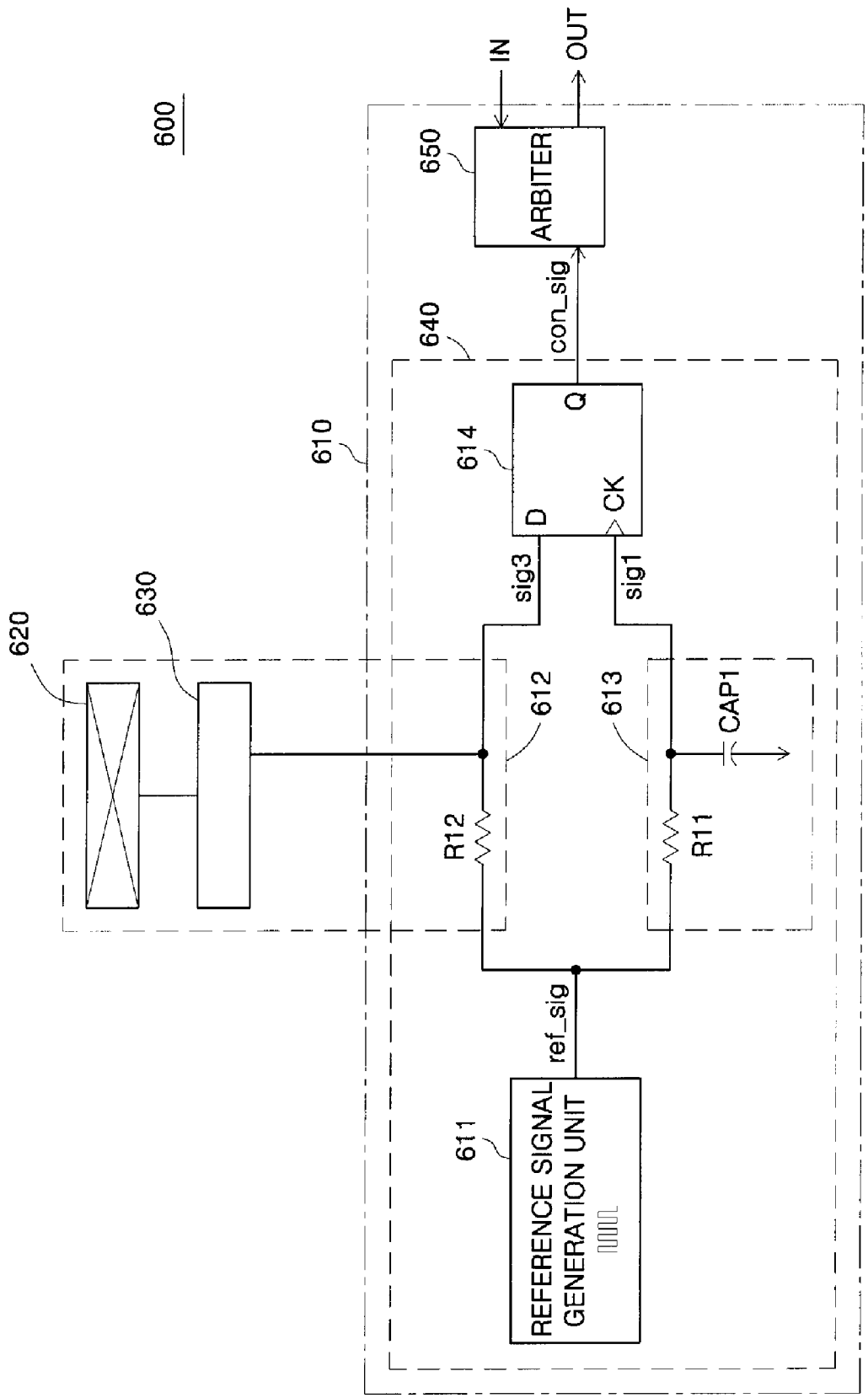

[Fig. 11]
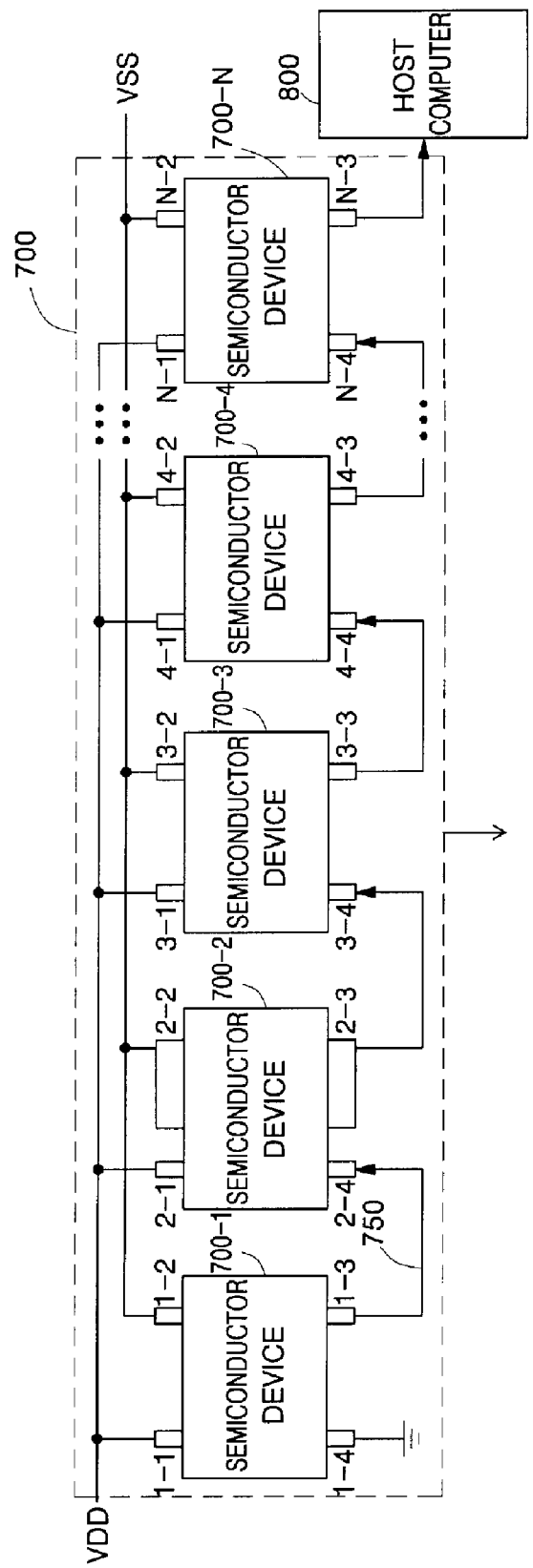

[Fig. 12]
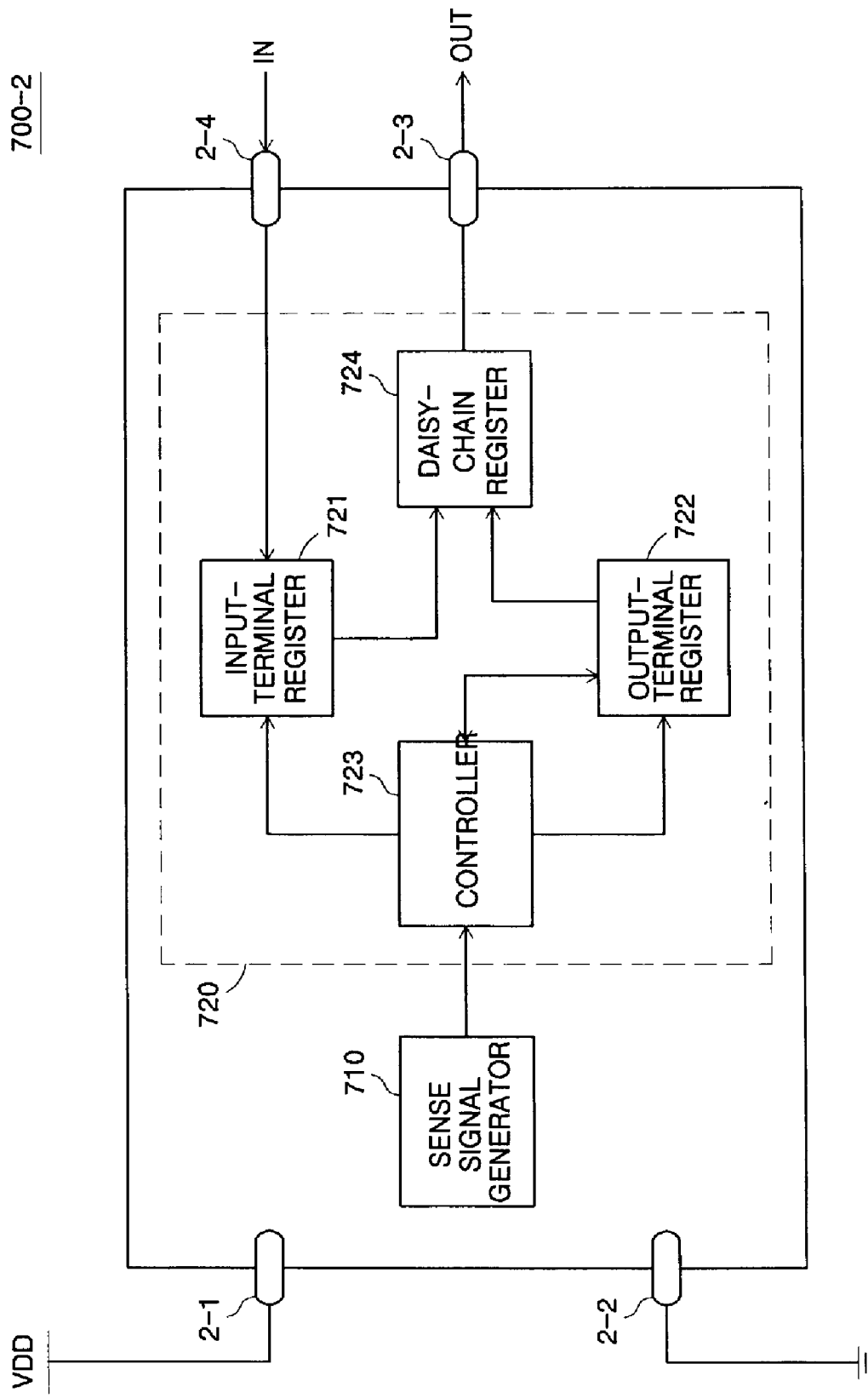

SEMICONDUCTOR DEVICE AND TOUCH SENSOR DEVICE

TECHNICAL FIELD

The present invention relates to a semiconductor device, and more particularly, to a semiconductor device for a single-channel touch sensor system which includes a semiconductor package having a touch pad, and a touch sensor device which operates in a daisy-chain communication mode and continuously transmits touch information about each semiconductor device.

BACKGROUND ART

A touch pad is a data input apparatus widely used instead of a mouse. The touch pad includes touch points arranged in a matrix form on a plane to detect where a user touches it and which direction the point contact moves. Conventionally, a variety of touch pads have been employed. For example, a touch pad may include electrical switches, capacitor-type sensors, resistor-type, or transistor-type sensors, arranged in a plane.

Among conventional touch pads, a touch pad using capacitor-type sensors is commonly used to control the motion of a cursor in notebook computers. The surface of the touch pad using the capacitor-type sensors is covered with an insulating layer, and horizontal lines and vertical lines are arranged at regular intervals under the insulating layer. Capacitors are disposed as electrical equivalent circuits between the horizontal lines and the vertical lines. The horizontal lines constitute first electrodes, while the vertical lines constitute second electrodes.

When a finger, serving as a conductor, comes into contact with the surface of the touch pad, the capacitance between horizontal and vertical lines corresponding to the point of contact differs from that between other lines so that the point of contact can be detected by applying a voltage signal to the horizontal lines and reading variation in capacitance from the vertical lines.

FIG. 1 is a circuit diagram of a conventional electrical touch sensor system. Referring to FIG. 1, the conventional electrical touch sensor system includes a plurality of touch pads 10-1 to 10-N, a semiconductor device 20, and a host computer 30, and the semiconductor device 20 includes a plurality of input/output terminals and a plurality of sense signal generators 20-1 to 20-N. The input/output terminals of the semiconductor device 20 are externally connected to a power supply voltage, a ground voltage, and the touch pads 10-1 to 10-N, respectively. Also, the sense signal generators 20-1 to 20-N of the semiconductor device 20 internally have input terminals connected respectively to the touch pads 10-1 to 10-N via the input/output terminals of the semiconductor device 20, and output terminals connected to the host computer 30 via the input/output terminals of the semiconductor device 20.

The touch pads 10-1 to 10-N generate touch signals indicating a change in electrical state when a touch object such as a finger, which can be regarded as a resistive mean with a certain degree of conductivity, is brought into contact with the touch pads 10-1 to 10-N.

The input/output terminals of the semiconductor device 20 are connected to the power supply voltage, the ground voltage, and the touch pads 10-1 to 10-N, respectively, to form a plurality of channels, so that the semiconductor device 20 can appropriately control touch information generated by the touch pads 10-1 to 10-N and a system requiring the touch information.

In this case, parasitic capacitance is inevitably generated among a plurality of adjacent channels. Thus, an interference signal may be generated between adjacent channels and a difference in touch sensitivity may result between channels. Consequently, respective touch sensor systems have different sizes of touch pads and semiconductor devices and different electrical characteristics. Therefore, the construction of each touch sensor system has conventionally involved an additional tuning process to adjust the sensitivities of respective channels and make the characteristics of the channels uniform.

FIG. 2 is a block diagram of the touch pad and an electrical touch sensor controller of the electrical touch sensor system shown in FIG. 1. Referring to FIG. 2, the electrical touch sensor controller includes a reference signal generation unit 21, a first signal generation unit 23, a second signal generation unit 22, and a sense signal generation unit 24.

Functions of the respective blocks will now be described.

The reference signal generation unit 21 generates a clock signal as a reference signal ref_sig and applies the clock signal to a first signal generation unit 23 and a second signal generation unit 22.

The first signal generation unit 23 always delays the reference signal ref_sig by a first time irrespective of whether a touch object contacts the electrical touch sensor system and generates a first signal sig1.

The second signal generation unit 22 includes the touch pad 10-N with which the touch object is in contact. Thus, the second signal generation unit 22 delays the reference signal ref_sig by a shorter time of the first time when the touch object is out of contact with the touch pad 10-N, and delays the reference signal ref_sig by a longer time than the first time and generates a second signal sig2 when the touch object is in contact with the touch pad 10-N.

In other words, the second signal generation unit 22 generates the second signal sig2 having a phase that leads that of the first signal sig1 when the touch object is out of contact with the touch pad 10-N, and generates the second signal sig2 having a phase that lags that of the first signal sig1 when the touch object is in contact with the touch pad 10-N.

In this case, the touch object may be any object having a predetermined capacitance, for example, the human body in which a large amount of charge can be accumulated.

The sense signal generation unit 30 is synchronized with the first signal sig1, samples and latches the second signal sig2, and generates a sense signal con_sig.

In this case, when the touch sensor system is disposed at a distance from a plurality of touch pads 10-1 to 10-N and a plurality of channels are formed between the touch sensor system and the touch pads 10-1 to 10-N, it is very difficult to make sensitivities of the respective channels uniform.

DISCLOSURE

Technical Problem

The present invention is directed to a semiconductor device for a single-channel touch sensor system which includes a semiconductor package having a touch pad, so that a process of adjusting touch sensitivities of respective channels can be simplified during the fabrication of a multi-channel touch sensor system.

Also, the present invention is directed to a touch sensor device for a multi-channel touch sensor system which operates in a daisy-chain communication mode and continuously transmits touch information about each semiconductor device.

Technical Solution

According to an aspect of the present invention, a semiconductor device includes: a die including a sense signal generator for sensing a touch signal to generate a sense signal; a conductive die-attach pad attached to the die to generate the touch signal; and a package for packaging the die and the die-attach pad, wherein the die-attach pad generates the touch signal depending on whether a touch object is brought into contact with the package.

According to another aspect of the present invention, a semiconductor device includes: a die including an uppermost metal layer and a sense signal generator for sensing a touch signal to generate a sense signal; a die-attach pad attached to the die for fixing the die; and a package for packaging the die and the die-attach pad, wherein the uppermost metal layer generates the touch signal depending on whether a touch object is brought into contact with the package.

According to still another aspect of the present invention, a semiconductor device includes: a die including a first metal layer and a second metal layer disposed at different levels on a top surface of the die, an insulating layer interposed between the first and second metal layers, and a sense signal generator for sensing a touch signal to generate a sense signal; a die-attach pad attached to the die for fixing the die; and a package for packaging the die and the die-attach pad, wherein the first metal layer generates the touch signal depending on whether a touch object is brought into contact with the package.

According to yet another aspect of the present invention, a touch sensor device includes a plurality of semiconductor devices connected in a serial communication mode, wherein each of the semiconductor devices includes: a die including a sense signal generator for sensing a touch signal to generate a sense signal; a conductive die-attach pad attached to the die to generate the touch signal; and a package for packaging the die and the die-attach pad, wherein the die-attach pad generates the touch signal depending on whether a touch object is brought into contact with the package.

Advantageous Effects

A semiconductor device according to the present invention enables the size and position of a touch pad to be known in advance during the fabrication of a die so that a sensitivity adjusting process can be simplified. Also, since the touch pad is included in a touch sensor, a system can be simply configured at low cost.

Furthermore, a touch sensor device according to the present invention requires no additional sensitivity adjusting process and enables a plurality of touch sensor systems to be constructed at low cost by simply connecting a small number of electrical signals.

DESCRIPTION OF DRAWINGS

FIG. 1 is a circuit diagram of a conventional electrical touch sensor system;

FIG. 2 is a block diagram of a touch pad and an electrical touch sensor controller of the electrical touch sensor system shown in FIG. 1;

FIG. 3 is a cross-sectional view of a semiconductor device according to an exemplary embodiment of the present invention;

FIG. 4 is a diagram showing the construction of a touch sensor of the semiconductor device shown in FIG. 3;

FIG. 5 is a signal waveform diagram showing a case where the touch sensor of FIG. 4 is in contact with a touch object;

FIG. 6 is a circuit diagram showing the case where the touch sensor of FIG. 4 is in contact with the touch object;

FIG. 7 is a cross-sectional view of a semiconductor device according to another exemplary embodiment of the present invention;

FIG. 8 is a diagram showing the construction of a die of the semiconductor device shown in FIG. 7;

FIG. 9 is a cross-sectional view of a semiconductor device according to yet another exemplary embodiment of the present invention;

FIG. 10 is a diagram showing the construction of a touch sensor of the semiconductor device shown in FIG. 9;

FIG. 11 is a block diagram for explaining a communication mode used to connect a plurality of semiconductor devices including touch pads; and FIG. 12 is a block diagram illustrating the internal configuration of each of the semiconductor devices shown in FIG. 11.

MODE FOR INVENTION

Hereinafter, a semiconductor device and a daisy-chain-communication-mode touch sensor device according to exemplary embodiments of the present invention will be described in detail. However, the present invention is not limited to the exemplary embodiments disclosed below, but can be implemented in various forms. The following exemplary embodiments are provided so that this disclosure will enable those of ordinary skill in the art to make and practice the present invention.

FIG. 3 is a cross-sectional view of a semiconductor device according to an exemplary embodiment of the present invention. Referring to FIG. 3, the semiconductor device includes a touch sensor 100, first and second lead frames 310 and 320, a bonding wire 220, and a semiconductor package 400, and the touch sensor 100 includes a die-attach pad 130 as a touch pad, an epoxy 120, and a die 110. Here, it should be clear that the die-attach pad 130 may be connected to the first lead frame 310 or the second lead frame 320 and further connected to an external touch pad.

Unlike in the conventional electrical touch sensor system having a touch pad disposed outside a semiconductor device, in the current embodiment of the present invention, the die-attach pad 130, which was conventionally used to fix the die 110, is utilized as a touch pad and attached to an inner portion of the semiconductor device over the die 110 by means of the epoxy 120.

Functions of the respective components of the semiconductor device according to the current embodiment of the present invention will now be described with reference to FIG. 3.

The die-attach pad 130 fixes the die 110 and emits heat generated by the die 110. Also, when a touch object comes into contact with the die-attach pad 130, the die-attach pad 130 senses a state of contact with the touch object and generates a touch signal indicating a change in electrical state.

The die 110 receives touch information from the die-attach pad 130 and appropriately controls a system requiring the touch information using the operation of a sense signal generator.

The epoxy 120, which is an insulating resin, is used to attach the die 110 to the die-attach pad 130 and fix the die 110.

The bonding wire 220 electrically connects input/output terminals of the sense signal generator included in the die 110 with the lead frames 310 and 320 that are connected to an external system. Thus, the bonding wire 220 transmits the change in electrical state occurring in the die-attach pad 130 to the die 110.

The semiconductor package 400 is formed of an insulating material, such as ceramic, and packages the die-attach pad 130, the die 110, the epoxy 120, the first and second lead frames 310 and 320, and the bonding wire 220, to protect them from the outside so that the die 110 can function efficiently. It is natural that an external electrode replaces with the die-attach pad 130 or adds to the die-attach pad 130 to minimize distance to a touching means like a human finger. For an example of chip-on-board package such as ball grid array package, the epoxy 120 plays a role to attach the die 110 to the board and the die-attach pad 130 is made of an electrode of the board.

Here, in order to minimize a distance to a touch means such as a human finger, the die-attach pad 130 may be replaced with an external electrode or the external electrode may be added onto the die-attach pad 130. For example, in the case of a ball grid array (BGA) package or a chip-on-board (COB) package, the epoxy 120 functions to attach the die 110 to a printed circuit board (PCB), and the die-attach pad 130 is formed of an electrode of the PCB.

FIG. 4 is a diagram showing the construction of the touch sensor 100 of the semiconductor device shown in FIG. 3. Referring to FIG. 4, the touch sensor 100 includes the die-attach pad 130, a sense signal generator 140, and an arbiter 150. And, the sense signal generator 140 includes a reference signal generation unit 111, a first signal generation unit 113, a second signal generation unit 112, and a sense signal generation unit 114.

The die-attach pad 130 is connected to the sense signal generator 140 over the sense signal generator 140 and transmits a touch signal. The first signal generation unit 113 includes a first resistor R11, which is interposed between the reference signal generation unit 111 and the sense signal generation unit 114, and a capacitor CAP1, which is interposed between the first resistor R11 and the sense signal generation unit 114 and connected to a ground voltage VSS. The second signal generation unit 112 includes a second resistor R12 interposed between the reference signal generation unit 111 and the sense signal generation unit 114, and the die-attach pad 130 interposed between the second resistor R12 and the sense signal generation unit 114 and disposed over the die 110 to allow a touch object having a capacitance to contact the die-attach pad 130.

In this case, the first and second resistors R11 and R12 enable a delay element between the reference signal generation unit 111 and the capacitor CAP1 to be equal to a delay element between the reference signal generation unit 111 and the die-attach pad 130. Thus, when the touch object is out of contact with the die-attach pad 130, the first and second resistors R11 and R12 minimize a difference in the delay element between the first signal generation unit 113 and the second signal generation unit 112. Also, when the first and second resistors R11 and R12 have similar values, the capacitor CAP1 has a smaller capacitance than the touch object. That is, the capacitor CAP1 has a smaller capacitance than an average capacitance CAP2 of the human body.

Meanwhile, the sense signal generation unit 114 may be any one of a D-flip-flop, a JK-flip-flop, a latch circuit, and combinatorial logics, which is synchronized with a first signal sig1 and receives and latches a touch signal. Hereinafter, for simplicity, it is assumed that the sense signal generation unit 114 is a D-flip-flop that operates in synchronization with a falling edge of the first signal sig1.

The sense signal generation unit 114 may have additional functions including the signal condition and an additional delay control of a sense signal con_sig in a digital manner, rather than adjusting the first resistor R11, the second resistor R12, and the capacitor CAP1.

The arbiter 150 receives touch information generated in previous semiconductor devices via an input terminal and temporarily stores the touch information. Thus, when the sense signal generator 140 of the present semiconductor device generates a high-level sense signal, the arbiter 150 outputs touch information of the previous semiconductor devices along with touch information of the present semiconductor device via an output terminal.

Hereinafter, operation of the semiconductor device according to the current exemplary embodiment of the present invention will be described with reference to FIGS. 3 and 4.

The reference signal generation unit 111 of the die 110 generates a clock signal as a reference signal ref_sig. The first signal generation unit 113 receives the reference signal ref_sig and always delays it by a first time irrespective of whether a touch object contacts the die-attach pad 130 and generates the first signal sig1. The second signal generation unit 112 includes the die-attach pad 130 for sensing a state of contact of the touch object. Thus, the second signal generation unit 112 receives the reference signal ref_sig and delays it by a shorter time of the first time when the die-attach pad 130 does not sense the state of contact of the touch object, and delays it by a longer time than the first time and generates a second signal sig2 when the die-attach pad 130 senses the state of contact of the touch object.

The sense signal generation unit 114 is synchronized with the first signal sig1, samples and latches the second signal sig2, generates a sense signal con_sig, and outputs the sense signal con_sig to the arbiter 150. The arbiter 150 receives touch information generated in the previous semiconductor device via the input terminal and temporarily stores the touch information. Thus, according to an internal algorithm, the arbiter 150 simply transmits the touch information generated in the previous semiconductor device when the sense signal con_sig is at a low level, and generates touch information about the present semiconductor device and outputs it along with the touch information generated in the previous semiconductor device via the output terminal when the sense signal con_sig is at a high level.

FIG. 5 is a signal waveform diagram showing a case where the touch sensor 100 of FIG. 4 is in contact with a touch object, and FIG. 6 is a circuit diagram showing a case where the touch sensor 100 of FIG. 4 is in contact with the touch object.

Referring to FIGS. 4 through 6, when the touch object is out of contact with the touch sensor 100, a delay element of the first signal generation unit 113 corresponds to the first resistor R11 and the first capacitor CAP1, and a delay element of the second signal generation unit 112 corresponds to the second resistor R12.

Thus, the first signal generation unit 113 delays the reference signal ref_sig by a first time t1 based on a resistor-capacitor (RC) value of the first resistor R11 and the first capacitor CAP1 and outputs the first signal sig1. When the touch object is out of contact with the touch sensor 100, the second signal generation unit 112 outputs a signal having a phase slightly faster than that of the reference signal ref_sig, as illustrated in FIG. 4. When the touch object is in contact with the touch sensor 100, the second signal generation unit 112 delays the reference signal ref_sig by a second time t2 that is longer than the first time t1 and outputs the second signal sig2, since the delay element further includes the capacitance CAP2 of the touch object, as illustrated in FIG. 6.

Thus, the sense signal generation unit 114, which is the D-flip-flop, is synchronized with a falling edge of the first signal sig1 and receives a high-level second signal sig2. Thereafter, the sense signal generation unit 114 outputs a high-level sense signal con_sig and informs the arbiter 150 of a constant state of the touch object. The arbiter 150 stores touch information of the previous semiconductor device, generates touch information of the present semiconductor device, and outputs the sum of the touch information of the previous semiconductor device and the touch information of the present semiconductor device so that cumulative touch information can be transmitted to the next semiconductor device.

FIG. 7 is a cross-sectional view of a semiconductor device according to another exemplary embodiment of the present invention. Referring to FIG. 7, the semiconductor device includes a die 500, an epoxy 120, a die-attach pad 130, first and second lead frames 310 and 320, a bonding wire 210, and a semiconductor package 400. And, the die 500 includes an uppermost metal layer 520 and an electrical touch sensor 510.

Unlike the previous embodiment in which the die-attach pad 130 is attached to an inner portion of the semiconductor device over the die 110 by means of the epoxy 120, in the current embodiment of the present invention, a touch pad is included as the uppermost metal layer 520 in the die 500 of the semiconductor device during the fabrication of the die 500.

Functions of the respective components of the semiconductor device according to the current embodiment of the present invention will now be described with reference to FIG. 7.

Since the die 500, the epoxy 120, the first and second lead frames 310 and 320, and the semiconductor package 400 are the same as in the previous embodiment described with reference to FIG. 3, they will not be described again here. However, although the uppermost metal layer 520 is generally used to electrically connect semiconductor devices, in the current embodiment of the present invention, the uppermost metal layer 520 is used as a touch pad. Specifically, the uppermost metal layer 520 functions to generate a touch signal indicating a change in electrical state when a touch object contacts the uppermost metal layer 520. Also, in the present embodiment, the die-attach pad 130 functions only to fix the die 500 and emit heat generated by the die 500, and neither senses a state of contact with the touch object nor generates the touch signal indicating change in electrical state.

The bonding wire 220 may electrically connect the uppermost metal layer 520, which is connected to input/output terminals of the die 500, with the lead frames 310 and 320 connected to an external system. However, the bonding wire 220 does not electrically connect the uppermost metal layer 520 with the die-attach pad 130.

Here, in order to reduce a distance between the uppermost metal layer 520 and a touch means such as a human finger, an external electrode may be added to the uppermost metal layer 520.

FIG. 8 is a diagram showing the construction of the die 500 of the semiconductor device shown in FIG. 7.

Referring to FIG. 8, the die 500 includes the uppermost metal layer 520 and the electrical touch sensor 510. The electrical touch sensor 510 includes a sense signal generator 540 and an arbiter 550, and the sense signal generator 540 includes a reference signal generation unit 511, first and second signal generation units 513 and 512, and a sense signal generation unit 514.

Since the construction and connection of components of the first signal generation unit 513, the sense signal generation unit 514, and the arbiter 550 are almost the same as in the touch sensor 100 described with reference to FIG. 4, an explanation thereof will not be presented here. However, although the second signal generation unit 512 includes a second resistor R12 interposed between the reference signal generation unit 511 and the sense signal generation unit 514 like in the previous embodiment, the uppermost metal layer 520 is connected to a point of contact between the second resistor R12 and the sense signal generation unit 514, and is used as a touch pad in the die 500 instead of a die-attach pad disposed outside the die 500.

Hereinafter, operation of the semiconductor device according to the current embodiment of the present invention will be described with reference to FIGS. 7 and 8. Operations of the reference signal generation unit 511 and the sense signal generation unit 514 are almost the same as described with reference to FIGS. 3 and 4. However, operation of the semiconductor device according to the current embodiment differs from that of the semiconductor device according to the previous embodiment in that the second signal generation unit 512 includes the uppermost metal layer 520 contacted by the touch object in the die 500, a reference signal ref_sig is delayed by a shorter time than a first time caused by the first resistor R11 and the first capacitor CAP1 in the first signal generation unit 513 when the touch object is not in contact with the uppermost metal layer 520, and the reference signal ref_sig is delayed by a second time that is longer than the first time to generate a first signal sig1 when the touch object is in contact with the uppermost metal layer 520.

Therefore, like in the previous embodiment, the sense signal generation unit 514 is synchronized with a first signal sig1, samples and latches the second signal sig2, generates a sense signal con_sig, and outputs the sense signal con_sig to the arbiter 550. The arbiter 550 stores touch information of the previous semiconductor device, generates touch information of the present semiconductor device, and outputs sum of the touch information of the previous semiconductor device and the touch information of the present semiconductor device so that cumulative touch information can be transmitted to the next semiconductor device.

FIG. 9 is a cross-sectional view of a semiconductor device according to yet another exemplary embodiment of the present invention. Referring to FIG. 9, the semiconductor device includes a die 600, an epoxy 120, a die-attach pad 130, first and second lead frames 310 and 320, a bonding wire 220, and a semiconductor package 400, and the die 600 includes an uppermost metal layer 620, an insulating layer 625, a second uppermost metal layer 630, and an electrical touch sensor 610.

The semiconductor device of FIG. 9 differs from the semiconductor device of FIG. 7 in that the insulating layer 625 and the second uppermost metal layer 630 serving as a capaciflector are added between the uppermost metal layer 620 serving as a touch pad and the electrical touch sensor 610.

Functions of the components of the semiconductor device according to the current embodiment of the present invention will now be described with reference to FIG. 9.

Since the uppermost metal layer 620, the epoxy 120, the first and second lead frames 310 and 320, the semiconductor package 400, and the bonding wire 220 are the same as in the previous embodiment described with reference to FIG. 7, they will not be described again here. However, a signal having the same potential as the uppermost metal layer 620 is applied to the second uppermost metal layer 630 functioning as the capaciflector to reduce parasitic capacitance between the uppermost metal layer 620 and the insulating layer 625 so that when a touch object is brought into contact with the uppermost metal layer 620, a greater change in capacitance results, thus increasing touch sensitivity.

Here, the capaciflector is a kind of sensor which includes a reflector plate interposed between two electrodes of a sensing plate and a ground plate to provide shielding from stray electric fields. The capaciflector senses when an object comes near by the same principle as a typical capacitor, specifically, that when an object having a different dielectric constant is inserted into the electric field, the capacitance changes.

In this case, parasitic capacitance is inevitably generated between the sensing plate and the ground plate, so that the sensitivity of the sensing plate is degraded. Thus, by employing the reflector plate to have the same potential and phase as the sensing plate, parasitic capacitance can be reduced and the sensitivity of the sensing plate increased.

FIG. 10 is a diagram showing the construction of the touch sensor 600 of the semiconductor device shown in FIG. 9. Referring to FIG. 10, the touch sensor 600 includes the uppermost metal layer 620, the second uppermost metal layer 630, and the electrical touch sensor 610. The electrical touch sensor 610 includes a sense signal generator 640 and an arbiter 650, and the sense signal generator 640 includes a reference signal generation unit 611, first and second signal generation units 613 and 612, and a sense signal generation unit 614.

Since the construction and connection of components of the first signal generation unit 613 and the sense signal generation unit 614 are almost the same as in the die 500 described with reference to FIG. 8, an explanation thereof will not be presented here. However, although the second signal generation unit 612 includes a second resistor R12 interposed between the reference signal generation unit 611 and the sense signal generation unit 614 like in the previous embodiment, the second uppermost metal layer 630 functioning as the capaciflector is additionally connected between the uppermost metal layer 620 functioning as a touch pad and a point of contact between the second resistor R12 and the sense signal generation unit 614.

While the uppermost metal layer 620 and the second uppermost metal layer 630 are shown to be connected to each other as shown in FIG. 10 for the sake of convenience, they are actually short-circuited and a circuit operation as the capaciflector is already known, so their descriptions will be omitted.

Hereinafter, operation of the semiconductor device according to the current embodiment of the present invention will be described with reference to FIGS. 9 and 10. Operations of the reference signal generation unit 611 and the sense signal generation unit 614 are almost the same as described with reference to FIGS. 7 and 8. However, operation of the semiconductor device according to the current embodiment differs from that of the semiconductor device described with reference to FIGS. 7 and 8 in that the first signal generation unit 613 includes the uppermost metal layer 520 contacted by the touch object and the second uppermost metal layer 630, which are adhered to each other. Furthermore, unlike in the previous embodiment described with reference to FIGS. 7 and 8, when the touch object is out of contact with the uppermost metal layer 620, a reference signal ref_sig is not delayed, and when the touch object is in contact with the uppermost metal layer 620, the reference signal ref_sig is delayed by a third time that is far longer than the second time t2 of FIG. 5, and a second signal sig2 is generated.

A signal having the same potential as the uppermost metal layer 620 is applied to the second uppermost metal layer 630 functioning as the capaciflector, so that when the touch object is brought into contact with the uppermost metal layer 620, parasitic capacitance decreases. As a result, a greater change in capacitance can be obtained to further increase the delay time of the second signal sig2.

Also, like in the previous embodiment described with reference to FIGS. 7 and 8, the first signal generation unit 613 always delays the reference signal ref_sig by a first time irrespective of whether the touch object is in contact with the uppermost metal layer 620, and generates a first signal sig1. Therefore, when the sense signal generation unit 614 is synchronized with the first signal sig1 and samples the second signal sig2, the sense signal generation unit 614 can latch data using a more stable time margin and finally generate a precise sense signal con_sig. As a result, the sense signal con_sig can be output through the second lead frame 320 to a system requiring external touch information, thereby increasing the sensitivity of the semiconductor device.

Therefore, the touch sensor system using the touch pad according to the present invention enables the size and position of the touch pad to be known in advance during fabrication of the die. Thus, the touch sensor system can be simply constructed to facilitate a sensitivity adjusting process. Also, since the die includes the touch pad, it is unnecessary to fabricate an additional touch pad so that the fabrication cost of the touch sensor system can be reduced.

FIG. 11 is a block diagram for explaining a communication mode for connecting a plurality of semiconductor devices including touch pads. Referring to FIG. 11, the communication module includes a plurality of semiconductor devices 700-1 to 700-N including a plurality of pins, a host computer 800, and a wire 750 for connecting the semiconductor devices 700-1 to 700-N with the host computer 800 in a daisy-chain communication mode. Since each of the semiconductor devices 700-1 to 700-N corresponds to one of the semiconductor devices according to the embodiments of the present invention described with reference to FIGS. 3 through 9, each of the semiconductor devices 700-1 to 700-N includes a sense signal generator and an arbiter disposed in a die. Therefore, an explanation of functions of components of the sense signal generator and the arbiter included in the die will be omitted here.

The semiconductor devices 700-1 to 700-N are connected in series by the wire 750 and include first pins 1-1 to N-1, each of which is connected to a power supply voltage VDD, and second pins 1-2 to N-2, each of which is connected to a ground voltage VSS. Also, third pins 1-3 to N-3 of the semiconductor devices 700-1 to 700-N are connected to fourth pins 2-4 to N-4 of the adjacent semiconductor devices 700-1 to 700-N, respectively.

As described above, the semiconductor devices 700-1 to 700-N are connected in a daisy-chain communication mode so that the third pin N-3 of the last semiconductor device 700-N is connected to the host computer 800. Also, a ground voltage is applied to the fourth pin 1-4 of the first semiconductor device 700-1 to transmit information indicating that the first semiconductor device is disposed the farthest distance from the host computer 800.

Functions of the respective components for explaining a communication mode for connecting the semiconductor devices having touch pads will now be described with reference to FIG. 11.

When a touch object is in contact with the touch pad included in each of the semiconductor devices 700-1 to 700-N, each of the semiconductor devices 700-1 to 700-N generates a touch signal indicating a change in electrical state and transmits touch information generated in the touch pad through the die by means of the pins. In this case, the arbiter of the die takes the sum of intrinsic identification numbers of the previous semiconductor devices and an intrinsic identification number of the present semiconductor device and transmits the sum to the next semiconductor device.

The host computer 800 receives intrinsic identification numbers of a plurality of adjacent semiconductor devices connected in a daisy-chain communication mode through the arbiter of the last semiconductor device and stores the intrinsic identification numbers. Thereafter, when a touch object is sensed by some of the semiconductor devices, the host computer 800 cumulatively receives the intrinsic identification numbers of the semiconductor devices contacting the touch object, recognizes a state of contact of the touch object, and appropriately controls a system requiring touch information.

The wire 750 serially connects the semiconductor devices 700-1 to 700-N, connects the power supply voltage VDD to the respective first pins 1-1 to N-1 of the semiconductor devices 700-1 to 700-N, connects the ground voltage VSS to the respective second pins 1-2 to N-2 of the semiconductor devices 700-1 to 700-N, and connects the fourth pins 2-4 to N-4 of the adjacent semiconductor devices 700-2 to 700-N to the third pins 1-3 to N-3, respectively, so that the third pin N-3 of the last semiconductor device 700-N can be connected to the host computer 800.

FIG. 12 is a block diagram illustrating the internal configuration of each of the semiconductor devices 700-1 to 700-N shown in FIG. 11. Referring to FIG. 12, each of the semiconductor devices 700-1 to 700-N includes a sense signal generator 710, an arbiter 720, and a plurality of pins N-1 to N-4, and the arbiter 720 includes an input-terminal register 721, an output-terminal register 722, a controller 723, and a daisy-chain register 724.

Sine the construction and connection of components of the sense signal generator 710 are the same as each of the sense signal generators 140, 540, and 640 of the electrical touch sensors 100, 510, and 610 shown in FIGS. 4, 6, 8 and 10, a description thereof will be omitted here.

The input-terminal register 721 receives intrinsic numbers of the previous semiconductor devices contacting a touch object, temporarily stores the received intrinsic numbers, and output the stored data under the control of the controller 723 if required.

The output-terminal register 722 receives a sense signal from the sense signal generator 710 of the present semiconductor device, temporarily stores the sense signal, and outputs the sense signal along with the intrinsic number of the present semiconductor device under the control of the controller 723 if required.

The controller 723 senses that the sense signal generation unit 114 of the present semiconductor device generates the sense signal, outputs the intrinsic number of the present semiconductor device according to an internal algorithm, stores the intrinsic number of the present semiconductor device in the output-terminal register 722, controls the input-terminal register 721 and the output-terminal register 722, and outputs the stored data.

The daisy-chain register 724 receives the intrinsic numbers of the adjacent semiconductor devices contacting the touch object from the input-terminal register 721 under the control of the controller 723, receives the intrinsic number of the present semiconductor device from the output-terminal register 722, figures out the sum of the received intrinsic numbers, and outputs the result out of the present semiconductor device.

Operation of the above-described communication module will now be described with reference to FIGS. 11 and 12.

Typically, a daisy-chain communication mode refers to a communication mode in which input/output apparatuses are connected in series to a central processing unit (CPU). In the present invention, the pins of the adjacent semiconductor devices 700-1 to 700-N are connected to one another by the wire 750 and finally connected to the host computer 800. Therefore, even if some of the semiconductor devices 700-1 to 700-N sense a touch object, touch information is cumulatively transmitted to the host computer 800 so that the host computer 800 is aware of the state of contact of the touch object.

For example, when a user's finger is out of contact with the first semiconductor device 700-1 but in contact with the second and third semiconductor devices 700-2 and 700-3, the semiconductor devices 700-1 to 700-N internally perform the following operations.

Initially, since the first semiconductor device 700-1 is out of contact with the finger, no data is stored in the input-terminal register 721 and the daisy-chain register 724 of the second semiconductor device 700-2.

The sense signal generator 710 of the second semiconductor device 700-2 outputs a high-level sense signal, and the controller 723 of the arbiter 720 receives the high-level sense signal and generates the intrinsic identification number of the second semiconductor device 700-2 according to the internal algorithm. The output-register 722 of the second semiconductor device 700-2 receives the identification number and outputs the identification number to the daisy-chain register 724 of the second semiconductor device 700-2 at a required point in time under the control of the controller 723.

Since the daisy-chain register 724 of the second semiconductor device 700-2 does not store touch information transmitted from the first semiconductor device 700-1 just prior to the second semiconductor device 700-2, the daisy-chain register 724 of the second semiconductor device 700-2 outputs only first touch information of the second semiconductor device 700-2, i.e., the intrinsic identification number of the second semiconductor device 700-2, through the third pin 2-3.

The third semiconductor device 700-3 receives the first touch information from the second semiconductor device 700-2 through the fourth pin 3-4, stores it in the input-terminal register 721 of the third semiconductor device 700-3, outputs it to the daisy-chain register 724 under the control of the controller 723, and temporarily stores it in the daisy-chain register 724.

Like the second semiconductor device 70-2, the third semiconductor device 700-3 senses the touch object, generates second touch information, i.e., the intrinsic identification number of the third semiconductor device 700-3, and outputs it to the daisy-chain register 724 under the control of the controller 723. In this case, the daisy-chain register 724 of the third semiconductor device 700-3 cumulatively stores the first and second touch information and outputs it through the third pin 3-3 of the third semiconductor device 700-3.

Meanwhile, assuming that the fourth semiconductor device 700-4 does not directly sense the user's finger, the fourth semiconductor device 700-4 receives the first and second touch information through the fourth pin 4-4 from the third semiconductor device 700-3 according to the daisy-chain communication mode and stores it in the daisy-chain register 724 of the arbiter 720. Thus, when the sense signal generator 710 of the fourth semiconductor device 700-4 generates a low-level sense signal, the controller of the fourth semiconductor device 700-4 decides that the fourth semiconductor device 700-4 is out of contact with the finger, and simply transmits the first and second touch information, which are generated in the second and third semiconductor devices 700-2 and 700-3, through the third pin 4-3 to the fifth semiconductor device 700-5.

In this process, the first and second touch information is transmitted via the last (N-th) semiconductor device 700-N to the host computer 800. As a result, the host computer 800 is informed that the user' finger is in contact with the second and third semiconductor devices 700-2 and 700-3, and can appropriately control a system requiring touch information.

Here, the intrinsic identification numbers of the semiconductor devices 700-1 to 700-N may be prepared in various manners. In a simple example, when power is initially supplied, the host computer 800 may allocate identification numbers to the semiconductor devices 700-1 to 700-N. In another example, since the final semiconductor device cannot receive a signal from other semiconductor devices, it is identified and numbers are given in order to semiconductor devices connected in a communication mode beginning with the final semiconductor device.

When touch pads are disposed at a distance from one another and a touch sensor system includes only one multi-channel semiconductor device, it requires very intricate tuning to make the sensitivities of respective channels uniform. However, by employing semiconductor devices including touch pads and a daisy-chain communication mode according to the present invention, a plurality of touch sensor systems can be configured at low cost by simply connecting a small number of electrical signals without an additional sensitivity adjusting process.

The semiconductor device may include more than one touch pad such that connection between semiconductors and a different number of touch pads helps in optimizing the cost and performance.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A semiconductor device comprising:
a die including a sense signal generator for sensing a touch signal to generate a sense signal;
a conductive die-attach pad attached to the die to generate the touch signal; and
a package for packaging the die and the die-attach pad,
wherein the die-attach pad generates the touch signal depending on whether a touch object is brought into contact with the package.

2. The semiconductor device according to claim 1, further comprising:
a plurality of pins for connecting a plurality of input/output terminals of the die to an external system and externally transmitting the sense signal; and
a plurality of bonding wires for transmitting the touch signal generated by the die-attach pad to the die and electrically connecting the input/output terminals of the die with the pins.

3. The semiconductor device according to claim 1, wherein the sense signal generator comprises:
a reference signal generation unit for generating a clock signal as a reference signal;
a first signal generation unit for receiving the reference signal and always delaying the reference signal by a first time irrespective of whether the touch object is in contact with the package to generate a first signal;
a second signal generation unit for receiving the reference signal, not delaying the reference signal when the die-attach pad does not sense the touch object, and delaying the reference signal by a longer time than the first time to generate a second signal when the die-attach pad senses the touch object; and
a sense signal generation unit synchronized with the first signal and for sampling and latching the second signal and generating the sense signal to output the sense signal through the pin to an external system.

4. The touch sensor device according to claim 1, wherein die-attach pad can be replaced by an external electrode to minimize distance to the touch object in case that the package is chip-on-board package.

5. A semiconductor device comprising:
a die including an uppermost metal layer and a sense signal generator for sensing a touch signal to generate a sense signal;
a die-attach pad attached to the die for fixing the die; and
a package for packaging the die and the die-attach pad,
wherein the uppermost metal layer generates the touch signal depending on whether a touch object is brought into contact with the package.

6. The semiconductor device according to claim 5, wherein the sense signal generator comprises:
a reference signal generation unit for generating a clock signal as a reference signal;
a first signal generation unit for receiving the reference signal and always delaying the reference signal by a first time irrespective of whether the touch object is in contact with the package to generate a first signal;
a second signal generation unit for receiving the reference signal, not delaying the reference signal when the uppermost metal layer does not sense the touch object, and delaying the reference signal by a longer time than the first time to generate a second signal when the uppermost metal layer senses the touch object; and
a sense signal generation unit synchronized with the first signal and for sampling and latching the second signal and generating the sense signal to output the sense signal through the pin to an external system.

7. The semiconductor device according to claim 5, further comprising a plurality of pins for connecting a plurality of input/output terminals of the die to an external system and externally transmitting the sense signal; and
a plurality of bonding wires for electrically connecting the input/output terminals of the die with the pins.

8. The semiconductor device according to claim 5, wherein the uppermost metal layer is disposed uppermost among a plurality of metal layers formed during a semiconductor fabrication process.

9. A semiconductor device comprising:
a die including a first metal layer and a second metal layer disposed at different levels on a top surface of the die, an insulating layer interposed between the first and second metal layers, and a sense signal generator for sensing a touch signal to generate a sense signal;
a die-attach pad attached to the die for fixing the die; and
a package for packaging the die and the die-attach pad,
wherein the first metal layer generates the touch signal depending on whether a touch object is brought into contact with the package.

10. The semiconductor device according to claim 9, further comprising a plurality of pins for connecting a plurality of input/output terminals of the die to an external system and externally transmitting the sense signal; and
  a plurality of bonding wires for electrically connecting the input/output terminals of the die with the pins.

11. The semiconductor device according to claim 9, wherein the first metal layer is disposed uppermost among a plurality of metal layers formed during a semi-conductor fabrication process, and
  the second metal layer is disposed under the first metal layer among the metal layers formed during the semiconductor fabrication process.

12. The semiconductor device according to claim 9, wherein the sense signal generator comprises:
  a reference signal generation unit for generating a clock signal as a reference signal;
  a first signal generation unit for receiving the reference signal and always delaying the reference signal by a first time irrespective of whether the touch object is in contact with the package to generate a first signal;
  a second signal generation unit for receiving the reference signal, not delaying the reference signal when the first metal layer does not sense the touch object, and delaying the reference signal by a longer time than the first time to generate a second signal when the first metal layer senses the touch object; and
  a sense signal generation unit synchronized with the first signal and for sampling and latching the second signal and generating the sense signal to output the sense signal through the pin to an external system.

13. The semiconductor device according to claim 12, wherein the sense signal generator generates the touch signal using the first metal layer, applies a signal having the same potential as the first metal layer to the second metal layer to increase a change in electrical state of the touch signal, and precisely senses the touch signal to generate the sense signal.

14. The semiconductor device according to claim 12, wherein when the sense signal generation unit is synchronized with the first signal and samples the second signal, the second signal is generated by delaying the reference signal by the longer time than the first time so that the sense signal generation unit latches data using a more stable time margin and precisely generates the sense signal.

15. A touch sensor device comprising a plurality of semiconductor devices connected in a serial communication mode,
  wherein each of the semiconductor devices comprises:
  a die including a sense signal generator for sensing a touch signal to generate a sense signal;
  a conductive die-attach pad attached to the die to generate the touch signal; and
  a package for packaging the die and the die-attach pad,
  the die-attach pad generating the touch signal depending on whether a touch object is brought into contact with the package.

16. The touch sensor device according to claim 15, wherein each of the semi-conductor devices further comprises an arbiter for receiving an identification number of the previous semiconductor device generating the sense signal, storing the identification number of the previous semiconductor device generating the sense signal, generating an identification number of the present semiconductor device when the touch object is in contact with the package of the present semiconductor device, and taking the sum of the identification number of the previous semiconductor device and the identification number of the present semiconductor device to output the result to the next semiconductor device.

17. The touch sensor device according to claim 15, wherein each of the semi-conductor devices includes a plurality of pins so that first pins are respectively connected to second pins of adjacent semiconductor devices by a wire, wherein even if some of the adjacent semiconductor devices sense the touch object, the sense signal is transmitted through the adjacent semiconductor devices to the last semiconductor device so that a state of contact with the touch object is detected.

18. The touch sensor device according to claim 17, wherein identification numbers of the semiconductor devices generating the sense signal are output to first pins, and
  a power supply voltage is applied to third pins, and a ground voltage is applied to fourth pins.

19. The touch sensor device according to claim 15, wherein the serial communication mode is a daisy-chain communication mode.

* * * * *